(12) United States Patent  
Blumschein et al.

(10) Patent No.: US 9,478,968 B2  
(45) Date of Patent: Oct. 25, 2016

(54) FAST DISTANCE PROTECTION FOR ENERGY SUPPLY NETWORKS

(75) Inventors: Joerg Blumschein, Berlin (DE); Cezary Dzienis, Dallgow-Doeberitz (DE); Matthias Kereit, Berlin (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 962 days.

(21) Appl. No.: 13/809,086

(22) PCT Filed: Jul. 9, 2010

(86) PCT No.: PCT/EP2010/059929  
§ 371 (c)(1),  
(2), (4) Date: Jan. 8, 2013

(87) PCT Pub. No.: WO2012/003888  
PCT Pub. Date: Jan. 12, 2012

(65) Prior Publication Data  
US 2013/0107405 A1 May 2, 2013

(51) Int. Cl.  
*H02H 1/00* (2006.01)  
*G01R 31/02* (2006.01)  
(Continued)

(52) U.S. Cl.  
CPC .......... *H02H 1/0092* (2013.01); *G01R 31/025* (2013.01); *G01R 31/085* (2013.01); *H02H 7/26* (2013.01)

(58) Field of Classification Search  
CPC .................................................. H02H 1/0092  
USPC .............................................. 361/79; 702/58  
See application file for complete search history.

(56) References Cited

U.S. PATENT DOCUMENTS

| 6,601,001 | B1 | 7/2003 | Moore |
| 2003/0055585 | A1 | 3/2003 | Stoupis et al. |

| 2008/0036466 | A1 | 2/2008 | Raber |

FOREIGN PATENT DOCUMENTS

| CN | 101483337 A | 7/2009 |
| CN | 101509939 A | 8/2009 |

(Continued)

OTHER PUBLICATIONS

Gabriel Benmouyal et al.: "A combined Directional and Faulted Phase Selector Element Based on Incremental Quantities", IEEE Transactions on Power Delivery, IEEE Service Center, New York, NY, US, vol. 16, No. 4, Oct. 1, 2001, XP011050079.

(Continued)

*Primary Examiner* — Tejal Gami  
(74) *Attorney, Agent, or Firm* — Laurence Greenberg; Werner Stemer; Ralph Locher

(57) ABSTRACT

A method for detecting a short circuit on a multiphase electrical energy supply network line includes recording current and voltage sampled values and generating a fault signal upon a fault evaluation performed by an electrical protection device indicating a short circuit. Instantaneous reference voltage values are calculated from instantaneous current and voltage sampled values recorded before the short, and instantaneous comparative voltage values are calculated from instantaneous current and voltage sampled values recorded before the short and instantaneous current and voltage sampled values recorded during the short, to generate a fault signal quickly. Then a rectified reference voltage value is calculated from consecutive instantaneous reference voltage values, and a rectified comparative voltage value is calculated from consecutive instantaneous comparative voltage values. The fault signal is generated if a difference between rectified comparative voltage and rectified reference voltage values exceeds a triggering threshold value. A corresponding electrical protection device is provided.

11 Claims, 6 Drawing Sheets

(51) Int. Cl.
*G01R 31/08* (2006.01)
*H02H 7/26* (2006.01)

(56) References Cited

FOREIGN PATENT DOCUMENTS

| CN | 101702506 A | 5/2010 |
|---|---|---|
| JP | 2008187825 A | 8/2008 |
| RU | 2073876 C1 | 2/1997 |
| RU | 2309507 C1 | 10/2007 |
| SU | 646403 A1 | 2/1979 |

OTHER PUBLICATIONS

Jian-Cheng Tan et al: "Sensitivity and Stability of Superimposed Component Based Directional Comparison Protection", Electrical and Computer Engineering, 2007, CCECE 2007, Canadian Conference on IEEE, PI, Apr. 1, 2007, pp. 280-283, XP031176520.

FAST DISTANCE PROTECTION FOR ENERGY SUPPLY NETWORKS

BACKGROUND OF THE INVENTION

Field of the Invention

The invention relates to a method for detecting a short circuit on a line of a multi-phase electrical energy supply network with earthed neutral, in which current and voltage sampled values are recorded by an electrical protection device at a measurement point at one end of the monitored line and a first fault signal indicating a short circuit on the line is generated if a fault evaluation of the current and voltage sampled values performed by the electrical protection device indicates a short circuit present on the line. The invention also relates to a correspondingly adapted electrical protection device.

With clear short circuits in electrical energy supply networks with earthed neutral, a particularly fast disconnection of the faulty line must be enabled. Due to the high short-circuit power, short circuits are particularly dangerous in such energy supply networks because they subject components of the energy supply network, such as lines, transformers, compensation systems, generators, etc, to high thermal load and may also lead to an "unstable" oscillatory operation with what are known as electrical oscillations. These two effects may lead to a permanent network failure ("blackout"), such that the energy supply is no longer ensured in specific network areas. So as to ensure the reliable operation of an energy supply network, a fast disconnection of the short circuit on the faulty line is therefore of great interest.

One of the fundamental protection methods for automatically monitoring lines of electrical energy supply networks is what is known as the distance protection method. An algorithm frequently used within the scope of distance protection to detect a short circuit on a line is based on the measurement of what is known as a short-circuit impedance. In this case, protection devices measure the impedance as far as the fault location and use this to determine the removal (distance) from the fault location. The short-circuit impedance (converted to the fault distance) is used to ascertain whether the detected short circuit actually lies on the line to be protected. To this end, the length of the line and the impedance coverage thereof must be known. If it is ascertained that the short circuit lies on the line to be protected, the line in question is disconnected and the faulty network portion is separated from the system. Further compliant operation of the network is thus ensured.

To perform this distance protection algorithm, current and voltage signals are sampled and evaluated at measurement points at each end of the monitored line. The temporal quantities must then be converted into complex quantities. This is achieved using filters which are specially designed for this task, which eliminate the undesired interference signals (for example DC components) and supply the real and imaginary part of the current and voltage indicators. In a simplified manner, the short-circuit impedance can be calculated on the basis of the complex quantities as the quotient of the complex voltage and the complex current. If this short-circuit impedance is less than the known line impedance, an internal fault is present in the monitored protection zone of the line.

The distance measurement may furthermore also be performed with the aid of complex "delta quantities" of current and voltage. These delta quantities can be established by comparing the measured values detected before the short circuit with measured values recorded during the short circuit. In this case, the portion of the current and voltage curve generated by the short circuit on the line is evaluated so to speak.

Both described methods have the disadvantage that, depending on the size of the measurement window used, a minimum number of sampled values is necessary to calculate the complex current and voltage values, and therefore a decision regarding the presence of a short circuit on the line can only be made with a specific delay.

BRIEF SUMMARY OF THE INVENTION

The object of the invention is therefore to specify a method and a corresponding protection device in such a way that a fault signal can be generated even more quickly than before, in particular in the event of clear faults on a monitored line.

To achieve this object in terms of the method, a method of the type specified in the introduction is designed in such a way that, for fault evaluation of the current and voltage sampled values, instantaneous reference voltage values are calculated for a reference point on the line from instantaneous current and voltage sampled values recorded before the occurrence of the short circuit, and instantaneous comparative voltage values are calculated for the reference point on the line from instantaneous current and voltage sampled values recorded before the occurrence of the short circuit and instantaneous current and voltage sampled values recorded during the fault. A rectified reference voltage value is then calculated from consecutive instantaneous reference voltage values, and a rectified comparative voltage value is calculated from consecutive instantaneous comparative voltage values. The rectified reference voltage value is compared with the rectified comparative voltage value and a first fault signal is generated if the difference of the rectified comparative voltage value and the rectified reference voltage value exceeds a triggering threshold value.

A particular advantage of the method according to the invention lies in the fact that a very fast decision regarding the presence of a short circuit on the line can be made as a result of the use of instantaneous values (instead of complex values) for the reference voltage values and the comparative voltage values, since it is not necessary to first wait for the complete length of a measurement window used. Since rectified values are then generated from these instantaneous values, the risk of an incorrect decision due to individual measurement errors or outliers in the sampled values of current and voltage can be prevented.

Due to the use of the method according to the invention, in the case of high-current short circuits on the line it is possible to form a corresponding fault signal after just a few milliseconds. Since the method functions exclusively with current and voltage sampled values detected at the local measurement points, there is no need for communication with other protection devices (for example at the other end of the line).

An advantageous development of the method according to the invention lies in the fact that the instantaneous reference voltage values are calculated by the following equation:

$$u_{ref}(n) = u_p(n) - L_{ref} \frac{i_p(n) - i_p(n-1)}{T} - R_{ref} \cdot i_p(n),$$

where $U_{ref}(n)$: instantaneous reference voltage value;

$U_p(n)=u(n-N)$: pre-fault voltage sampled value a network period before the instantaneous voltage sampled value $u(n)$;

$i_p(n)=i(n-N)$: pre-fault current sampled value a network period before the instantaneous current sampled value $i(n)$;

T: period;

N: number of sampled values per period;

n: number of the sampled value after fault occurrence;

$L_{ref}$: inductance of the line from the measurement point to the reference point;

$R_{ref}$: resistance of the line from the measurement point to the reference point.

The reference voltage values can thus be established merely on the basis of the sampled values detected before the occurrence of the fault and known line parameters.

In accordance with a further advantageous embodiment of the method according to the invention, the instantaneous comparative voltage values are calculated by the following equation:

$$u_v(n) = \Delta u_f(n) - L_{ref} \frac{\Delta i_f(n) - \Delta i_f(n-1)}{T} - R_{ref} \cdot \Delta i_f(n),$$

where $u_v(n)$: instantaneous comparative voltage value;

$\Delta u_v(n)$: instantaneous delta voltage value after fault occurrence;

$\Delta i_f(n)$: instantaneous delta current value after fault occurrence;

$L_{ref}$: inductance of the line from the measurement point to the reference point;

$R_{ref}$: resistance of the line from the measurement point to the reference point;

T: period;

n: number of the sampled value after fault occurrence.

The comparative values can thus be established on the basis of delta quantities for currents and voltages and the known line parameters.

Specifically, to establish the delta quantities, the instantaneous delta voltage values may be established by the following equation:

$$\Delta\Delta u_f(n)=u(n)-u_p(n)$$

where $\Delta u_f(n)$: instantaneous delta voltage value after fault occurrence;

$u(n)$: instantaneous voltage sampled value after fault occurrence;

$u_p(n)=u(n-N)$: pre-fault voltage sampled value a period before the instantaneous voltage sampled value $u(n)$;

n: number of the sampled value after fault occurrence;

N: number of the sampled values per period, and the instantaneous delta current values may be established by the following equation:

$$\Delta i_f(n)=i(n)-i_p(n)$$

where $\Delta i_f(n)$: instantaneous delta current value after fault occurrence;

$i(n)$: instantaneous current sampled value after fault occurrence;

$i_p(n)=i(n-N)$: pre-fault current sampled value a period before the instantaneous current sampled value $i(n)$;

n: number of the sampled value after fault occurrence;

N: number of the sampled values per period.

The delta quantities can thus be calculated on the basis of the sampled values recorded before the short circuit and during the short circuit.

Specifically, with regard to the rectified reference voltage value and the rectified comparative voltage value, the rectified reference voltage value may further be calculated by the following equation:

$$U_{ref}(n) = \frac{2}{N} \sum_{k=n-(\frac{N}{2}-1)}^{n} (|u_{ref}(k)|),$$

where $U_{ref}(n)$: rectified reference voltage value;

$u_{ref}(k)$: instantaneous reference voltage value for the sampled value k;

n: number of the sampled value after fault occurrence;

N: number of sampled values per period;

k: summation index, and the rectified comparative voltage value can be calculated by the following equation:

$$U_V(n) = \frac{2}{N} \sum_{k=n-(\frac{N}{2}-1)}^{n} (|u_V(k)|)$$

where $U_v(n)$: rectified comparative voltage value;

$u_v(k)$: instantaneous comparative voltage value for the sampled value k;

n: number of the sampled value after fault occurrence;

N: number of sampled values per period;

k: summation index.

It is also considered to be particularly advantageous if the end of a monitoring zone on the line monitored by the protection device is used as the reference point.

With this advantageous development of the method according to the invention, the fault signal can be established very easily for the complete monitored monitoring or protection zone on the line (for example 85% of the line length, starting from the measurement point at which the protection device in question is located).

In accordance with a further advantageous embodiment of the method according to the invention, the protection device detects the start of a short circuit when the recorded current sampled values have a current jump that exceeds a jump threshold value, a first initiation signal is generated when the protection device has detected the start of a short circuit, and the protection device only starts the fault evaluation of the current and voltage sampled values once the first initiation signal is present.

The method according to the invention can thus be performed in a particularly resource-saving manner, since the fault evaluation of the current and voltage sampled values is then only initiated when the protection device has detected the presence of a short circuit on the line on the basis of a current jump, and no further processing capacity otherwise has to be used for the evaluation of the current and voltage sampled values.

In this regard, in accordance with a further advantageous embodiment of the method according to the invention, with the presence of a first initiation signal the protection device first examines the current and voltage sampled values to establish which phase conductor of the line is affected by the short circuit, a second initiation signal is generated that indicates at least one phase conductor affected by the short circuit, and the protection device performs the fault evaluation merely with regard to the at least one phase conductor indicated by the second initiation signal.

The method can thus be performed with even fewer resources, since a fault evaluation of the current and voltage sampled values is merely carried out with regard to the fault loops actually affected by the short circuit.

In accordance with a further advantageous embodiment of the method according to the invention, the triggering threshold value is dynamically determined in such a way that the value of the triggering threshold value decreases at least in steps with an increasing number of the current and voltage sampled values used to calculate the rectified comparative voltage value.

The sensitivity of the method according to the invention can thus be adapted particularly advantageously to the number of sampled values forming the basis of the evaluation. With an increasing number of sampled values, the result of the fault evaluation is specifically more reliable, and therefore the triggering threshold value used for the formation of the fault signal can be reduced.

In accordance with a further advantageous embodiment of the method according to the invention, the instantaneous current and voltage sampled values are also used to calculate a complex impedance value of the line monitored by the protection device, and a second fault signal indicating a short circuit on the line is generated by the protection device if the complex impedance value lies within a predefined triggering area in the complex plane.

A conventional distance protection algorithm, which is based on the calculation of complex fault impedances, can thus be performed virtually in parallel with the above-described method according to the invention. A decision regarding the presence of a short circuit can thus be made even more reliably.

Lastly, in this regard and in accordance with a further advantageous embodiment of the method according to the invention, as soon as the first or the second fault signal is present the protection device generates a trigger signal to trigger a power circuit breaker defining the line.

A fault signal may then be generated even if merely one of the two distance protection algorithms has detected a short circuit on the line, and therefore the fastest algorithm for the specific short circuit event can disconnect the line. The reliability of the method is thus further increased.

With regard to the protection device, the above-stated object is achieved by a protection device for monitoring a line of a multi-phase electrical energy supply network with earthed neutral for short circuits occurring on the line, wherein the protection device is adapted to perform a method according to one of claims 1 to 11.

DESCRIPTION OF THE SEVERAL VIEWS OF THE DRAWING

The invention will be explained in greater detail hereinafter on the basis of exemplary embodiments. To this end, in the drawings.

DESCRIPTION OF THE INVENTION

Figure 1:
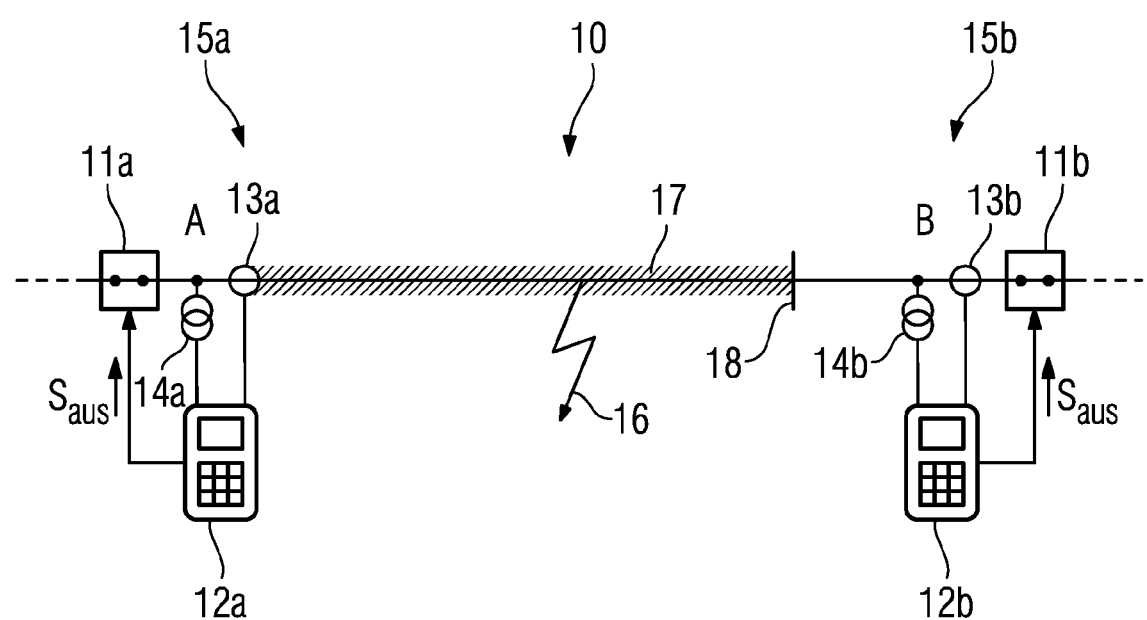
FIG. 1 shows a schematic view of a monitored line of a multi-phase electrical energy supply network.

FIG. 1 shows a line 10 of a multi-phase electrical energy supply network not otherwise illustrated in greater detail. The line 10 is defined at its two ends A and B by power circuit breakers 11a and 11b, via which, in the event of a fault, the affected phase conductor of the line 10 can be disconnected. Electrical protection devices 12a and 12b are provided for this purpose at the line ends A and B at measurement points 15a and 15b. Current and voltage signals recorded at the respective measurement points 15a, 15b by means of merely schematically illustrated current transformers 13a, 13b and voltage transformers 14a, 14b are fed to said protection devices.

The protection devices 12a, 12b sample the current and voltage signals by means of an A/D conversion and perform a fault evaluation for the current and voltage sampled values thus generated so as to be able to detect any short circuits 16 on the line 10. In the event of such a short circuit 16, said short circuit may be either a single-pole short circuit between a phase conductor and earth or a two-pole or multi-pole short circuit involving a plurality of phase conductors. If the fault evaluation reveals a short circuit 16 on the line, a trigger signal $S_{aus}$ is thus generated and fed to the respective power circuit breaker 11a, 11b so as to allow said power circuit breaker to open its switching contacts and to thus disconnect the phase conductor(s) affected by the short circuit 16 from the rest of the energy supply network.

Such a fault evaluation on the basis of current and voltage sampled values recorded merely at one end cannot normally be performed for the complete line length, since the sampled values established at a measurement point, for example the measurement point 15a at the line end A, can only be detected very imprecisely in the event of a short circuit present in the vicinity of the respective other line end, for example the line end B, due to the high line impedance from the measurement point to the fault point. For this reason, "monitoring zones" or "protection zones", which specify the line length starting at the respective measurement point 15a, 15b and are effectively monitored by the protection device 12a or 12b, are normally set in the protection devices 12a, 12b. Such a monitoring zone 17 is illustrated schematically in FIG. 1 by a hatching of a part of the line 10 monitored by the protection device 12a. The length of a monitoring zone is normally predefined as a parameter in the respective protection device 12a, 12b as a percentage of the line length; for example, a monitoring zone may be 85% of the total length of the line 10. The end 18 of the respective protection zone 17 is also referred to as a "tip point".

Exemplary embodiments for a distance protection method performed by the protection device 12a at the line end A will now be explained on the basis of the following figures so as to quickly detect and isolate a short circuit 16 occurring in the monitoring zone 17.

The fast distance protection method explained hereinafter is used for fault evaluation of the current and voltage sampled values or what are known as delta values, which are established by the superposition principle, which will therefore first be explained briefly hereinafter.

Figure 2:
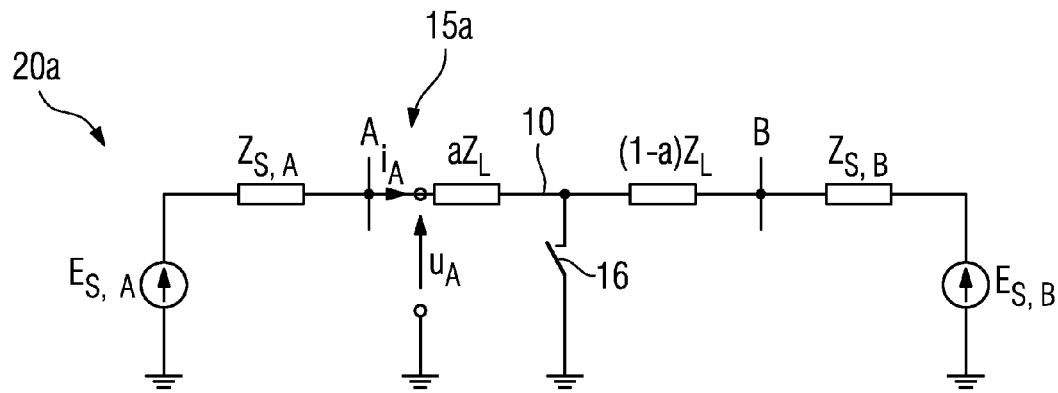
FIG. 2 shows three electrical equivalent circuit diagrams of the monitored line in order to explain the superposition principle.
Figure 2:
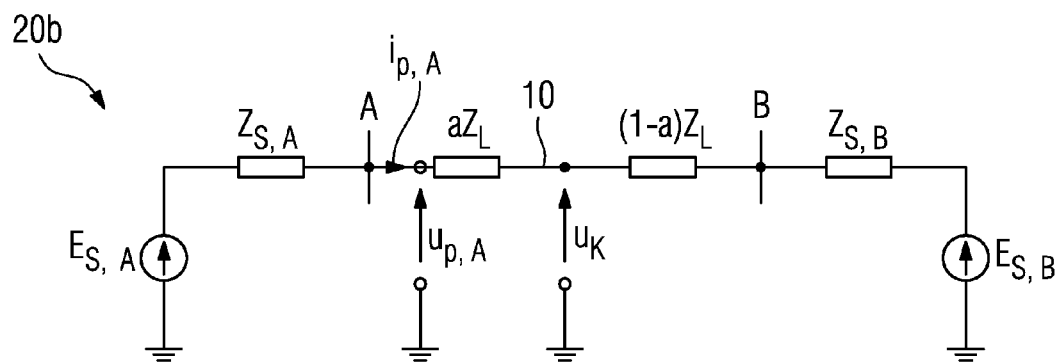
Figure 2:
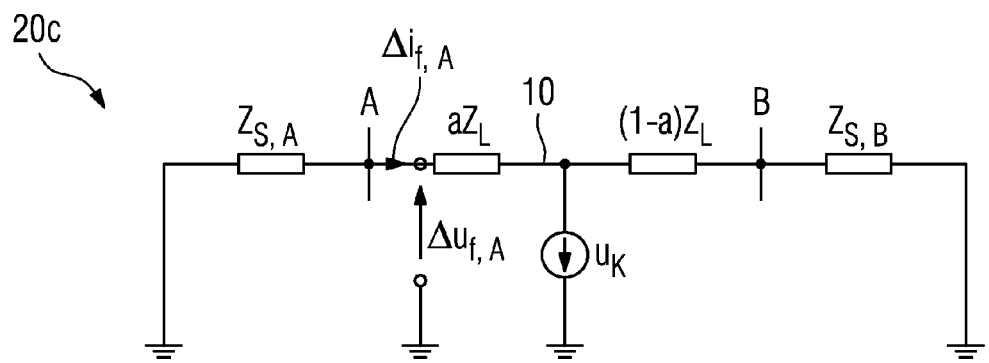

Any linear electrical circuit can be split into a plurality of equivalent circuits in accordance with the superposition principle, wherein all equivalent circuits must have the same passive topologies as the original circuit. In addition, the electrical sum of all active elements (energy sources and energy depressions) of the circuits split by the superposition principle must correspond to the active elements of the actual starting circuit. An equivalent circuit 20a of the line 10 from FIG. 1 affected by the short circuit 16 is shown in FIG. 2 (in FIG. 2 like reference signs have been selected for components corresponding to components from FIG. 1). The line 10 is fed by voltage sources $E_{S,A}$ and $E_{S,B}$, with corresponding input impedances $Z_{S,A}$ and $Z_{S,B}$, from both line ends A, B. The current signal $i_A$ and the voltage signal $u_A$ can be tapped at the measurement point 15a. The short circuit 16 is simulated by closing a switch. The line impedance $Z_L$ relates to the entire length of the line 10; the line impedance from the measurement point 15a at the line end A to the fault point can accordingly be given by a·$Z_L$ (a is the distance of the line end A from the fault point, based on the total line length).

The equivalent circuit 20a in FIG. 2 can be split by the superposition principle into an equivalent circuit 20b, which mirrors the operating state of the line 10 before the occurrence of the short circuit 16, and an equivalent circuit 20c, which shows the changes to the state of the line 10 caused by the occurrence of the short circuit 16.

The equivalent circuit 20b comprises the voltage sources $E_{S,A}$ and $E_{S,B}$. The voltage $u_k$ is applied at the point at which the short circuit 16 occurs in the equivalent circuit 20a. The pre-fault voltage $u_{p,A}$ and the pre-fault current $i_{p,A}$ are present at the measurement point 15a.

The further equivalent circuit 20c represents the situation after the change to the network topology. The current and voltage quantities obtained from this circuit are called delta quantities $\Delta i_{f,A}$ and $\Delta u_{f,A}$, since they relate to the changes to current and voltage caused by the short circuit. These delta quantities are driven by the notional voltage source $-u_k$ at the fault point, said notional voltage source representing the short circuit 16.

The equivalent circuit 20a is consequently provided with an overlay (superposition) of the equivalent circuits 20b (situation before the short circuit) and 20c (changes caused by the short circuit).

Figure 3:
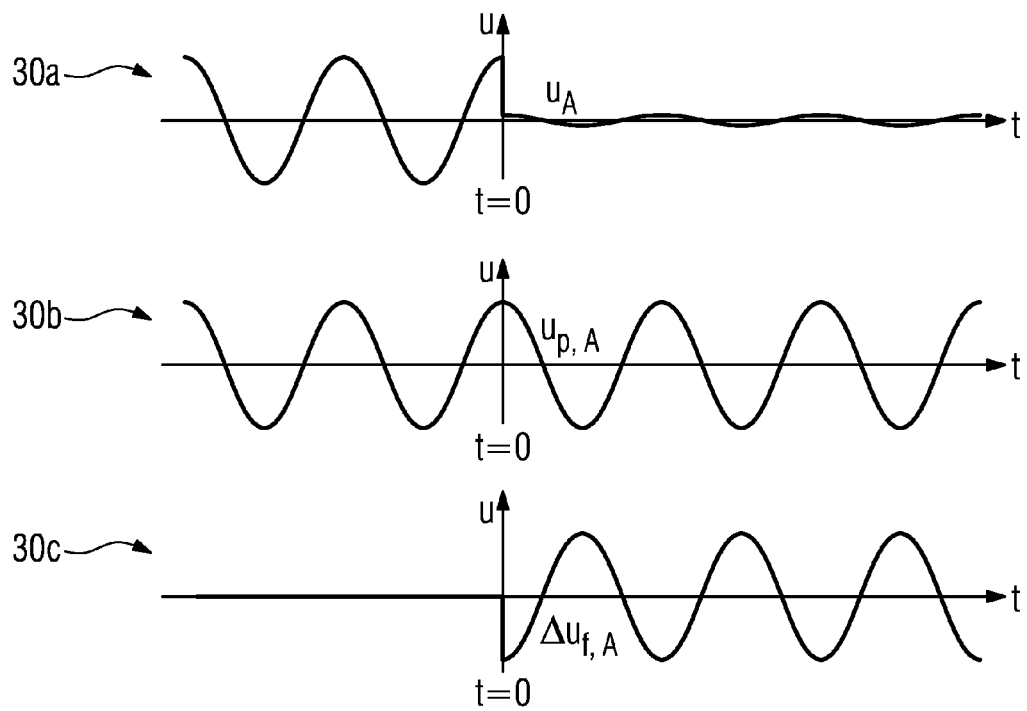
FIG. 3 shows three diagrams with voltage curves in order to explain the superposition principle.

Since, in actual fact, the network topology and its components are unknown due to the lack of information regarding the distance a to the fault location, the delta quantities of currents and voltages cannot be determined from the calculation of the network circuit. They can be determined, however, by establishing the difference between the pre-fault quantities and $i_{p,A}$, $u_{p,A}$ and the fault quantities $i_A$, $u_A$. In this case, it is assumed that the pre-fault quantities reflect stable network behavior. FIG. 3 shows the relationship between fault quantities $i_A$, $u_A$, pre-fault quantities $i_{p,A}$, $u_{p,A}$ and delta quantities $\Delta i_{f,A}$, $\Delta u_{f,A}$, again in the form of three diagrams 30a, 30b and 30c. In this case, the diagram 30a shows the temporal curve of the actual voltage $u_A$ measured at the measurement point 15a before and after the occurrence of the short circuit at t=0. The diagram 30b shows the situation as if no fault has occurred, and thus relates merely to the curve of the pre-fault quantities $u_{p,A}$ whereas the curve of the delta voltage $\Delta u_{f,A}$ shown in diagram 30c relates exclusively to the changes produced by the short circuit. If the curves of the pre-fault quantities $u_{p,A}$ and delta quantities $\Delta u_{f,A}$ are added together, the curve of the voltage $u_A$ actually detected at the measurement point 15a is in turn given, and the respective delta quantities can therefore be calculated by establishing the difference between the curves for the voltage $u_A$ and the pre-fault voltage $u_{p,A}$.

Figure 4:
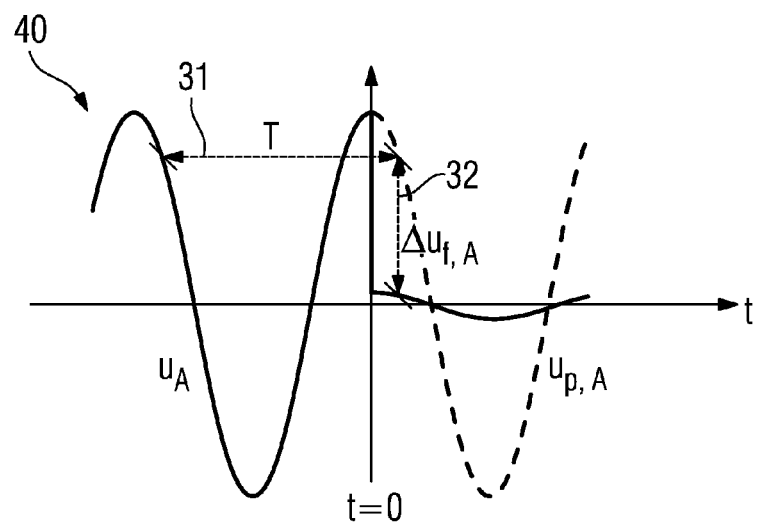
FIG. 4 shows a diagram with a voltage curve in order to explain the numerical establishment of delta quantities.

The procedure during the practical calculation of the delta quantities for current and voltage is illustrated in greater detail in FIG. 4. FIG. 4 shows a diagram 40, in which the curve of the voltage $u_A$ actually detected at the measurement point 15a is illustrated by a broken line. It can be seen that the voltage $u_A$ falls suddenly with the start of the short circuit at t=0 and then progresses with an accordingly lower amplitude. The (notional) curve of the pre-fault voltage $u_{p,A}$ after the occurrence of a fault at t=0 is plotted by means of the dashed line and would be produced if no short circuit had occurred at t=0. The value of the respective pre-fault voltage $u_{p,A}$ can be established by means of a temporal shift along the time axis by a full oscillation period T (or a multiple of a full oscillation period), as is indicated by an arrow 31 in FIG. 3. The following relationship is consequently true for the pre-fault voltage:

$$u_{p,A}(t)=u_A(t-T).$$

In practice, the detected sampled values consequently have to be stored in the protection device 12a (see FIG. 1) performing the fault evaluation for the duration of at least one full oscillation period so as to be able to calculate the curve of the notional pre-fault quantities $u_{p,A}$. As can also be deduced from FIG. 3, the curve of the delta voltage $\Delta u_{f,A}$, as indicated by further arrow 32, can be determined by establishing the difference as follows $$\Delta u_{f,A}(t)=u_{p,A}(t)-u_A(t).$$

There is also a mathematical link between the pre-fault quantities and the delta quantities, namely the voltage $u_k$ at the fault point, which can be determined from the two quantities. This notional voltage source is the deciding factor for the distance determination of the fault:

$$u_k=u_A-aZ_L\cdot i_A$$

and $$u_k=\Delta u_{f,A}=aZ_L\cdot \Delta i_{f,a},$$

wherein, as explained above, $u_A$ and $i_A$ are measurable quantities and $\Delta u_{f,A}$ and $\Delta i_{f,A}$ are calculated quantities.

An unknown quantity, however, is the impedance $aZ_L$ as far as the fault point, which reflects the short-circuit point of the network. So as to decide whether the short circuit lies in the region to be protected (monitoring zone 17, see FIG. 1), a setting $Z_{ref}$ for a reference point 18, which advantageously lies at the end of the monitoring zone 17, has to be introduced and thus determines the corresponding monitoring zone. This setting $Z_{ref}$ can be integrated into the calculation such that it is possible to determine the fault position in such a way that faults within the monitoring zone can be distinguished from faults outside the monitoring zone. With regard to the pre-fault voltages, a notional reference voltage at the end of the set monitoring zone can thus be calculated before the occurrence of a fault by means of the setting $Z_{ref}$. On the other hand, a notional comparative voltage can also be determined at the fault point with use of the setting $Z_{ref}$ and the delta voltages, and would be present if the fault were to occur at the end of the monitoring zone. The following conclusions can be drawn from the analysis of the two calculated voltages:

If the short circuit is located at the end of the monitoring zone ($aZ_L = Z_{ref}$), the values for the reference voltage and the comparative voltage (almost) match.

If the short circuit is located in the monitoring zone ($aZ_L < Z_{ref}$), the comparative voltage calculated from the delta voltages is greater than the reference voltage.

If the fault is located outside the zone ($aZ_L > Z_{ref}$ or) $aZ_L < 0$, the reference voltage is greater than the comparative voltage given from the delta voltages.

The delta quantities may thus be helpful for the distance measurement. So as to have no time delay with the method based on the delta quantities due to the use of time windows for the calculation of complex quantities, the method is implemented in terms of time with instantaneous values. In this case, it is not necessary to convert pre-fault quantities and delta quantities into the complex form. The decision made by the protection device regarding the presence of a short circuit can thus be accelerated because there is no need to wait until a measurement window has been filled with measured values and the complex quantities can be calculated. Similarly to the previously described procedure, the instantaneous reference voltage values and the instantaneous comparative voltage values are first established. This establishment process will be explained on the basis of the equivalent circuits 50a and 50b shown in FIG. 5.

Figure 5:
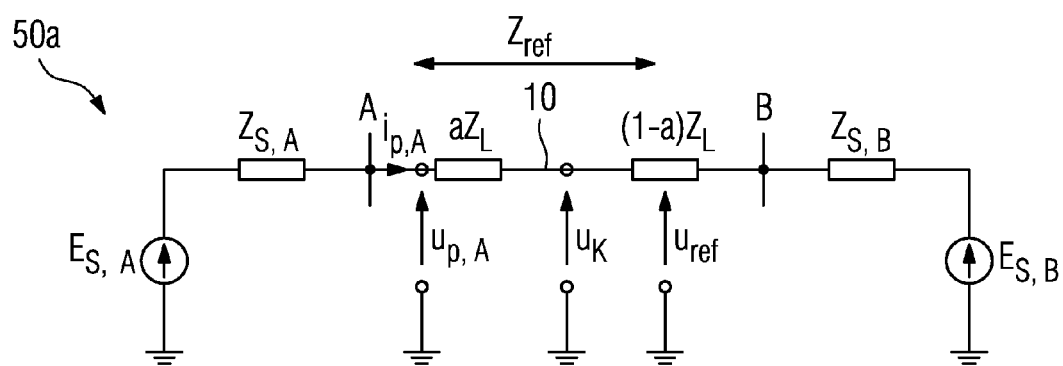
FIG. 5 shows two equivalent circuit diagrams of the monitored line in order to explain the function of a fast distance protection algorithm.
Figure 5:
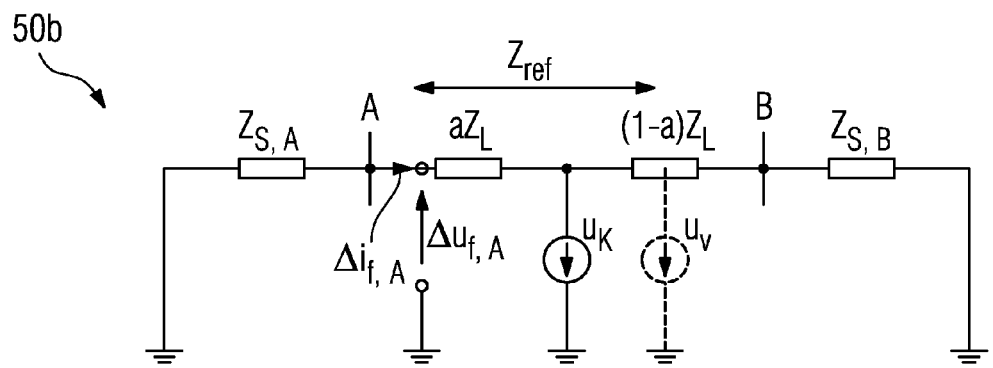

The calculation of the reference voltage $u_{ref}$ can be explained on the basis of the equivalent circuit 50a in FIG. 5. This equivalent circuit reflects the pre-fault quantities. The reference voltage $u_{ref}$ is determined by means of the following equation based on the sampled values n:

$$u_{ref}(n) = u_p(n) - L_{ref}\frac{i_p(n) - i_p(n-1)}{T} - R_{ref} \cdot i_p(n),$$

wherein the impedance $Z_{ref}$ has been replaced by the equivalent inductance $L_{ref}$ and the resistance $R_{ref}$. Furthermore, $u_p(n) = u(n-N)$ means a pre-fault voltage sampled value, which has occurred a period T before the instantaneous voltage sampled value u(n), and $i_p(n) = i(n-N)$ means a pre-fault current sampled value, which has occurred a period T before the instantaneous current sampled value u(n). The number of sampled values per period is N. The index n stands for the number of the sampled value after fault occurrence.

For fault evaluation, a comparative voltage $u_v$ given from the delta quantities (that is to say the changes caused by the short circuit) of current and voltage at the end of the monitoring zone set by the impedance $Z_{ref}$. This comparative voltage $u_v$ can be calculated by means of the equivalent circuit 50b from FIG. 5. In this case, the delta quantities first have to be established as the difference of the instantaneous sampled values and the corresponding pre-fault sampled values, that is to say the stored sampled values, which were detected an oscillation period (or a plurality thereof) before the current sampled values. The comparative voltage based on the sampled values n is given by means of these delta quantities $\Delta u_f$ and $\Delta i_f$ as follows:

$$u_v(n) = \Delta u_f(n) - L_{ref}\frac{\Delta i_f(n) - \Delta i_f(n-1)}{T} - R_{ref} \cdot \Delta i_f(n),$$

The illustrated equations for $u_{ref}$ and $u_v$ initially only allow a calculation of instantaneous values, which are too imprecise for fault evaluation, since they could be tainted by measurement errors, outliers or random fluctuations. Instantaneous values therefore do not provide a reliable basis for fault evaluation. For this reason, it is proposed to perform the assessment on the basis of rectified values of the reference voltage $u_{ref}$ and the comparative voltage $u_v$. The rectified reference voltage $U_{ref}$ is established as follows:

$$U_{ref}(n) = \frac{2}{N} \sum_{k=n-(\frac{N}{2}-1)}^{n} (|u_{ref}(k)|)$$

where
$U_{ref}(n)$: rectified reference voltage value;
$u_{ref}(k)$: instantaneous reference voltage value for the sampled value k;
n: number of the sampled value after fault occurrence;
N: number of sampled values per period;
k: summation index.

So as to shorten the calculation and thus increase the speed of the method, the rectified reference voltage can be determined during a half network period. Since the rectified reference voltage remains constant before the occurrence of a fault, it can be measured without difficulty.

The rectified comparative voltage $U_v$ is accordingly determined by the following equation:

$$U_V(n) = \frac{2}{N} \sum_{k=n-(\frac{N}{2}-1)}^{n} (|u_V(k)|)$$

where
$U_v(n)$: rectified comparative voltage value;
$u_v(k)$: instantaneous comparative voltage value for the sampled value k;
n: number of the sampled value after fault occurrence;
N: number of sampled values per period;
k: summation index.

This means that the method with a sampling frequency of 1 kHz requires at most 10 sampled values so as to be able to determine the rectified comparative voltage $U_v$. The decision with regard to a short circuit located on the line can consequently be met after a maximum of 10 sampled values, whereby a considerable increase in speed is achieved.

Figure 6:
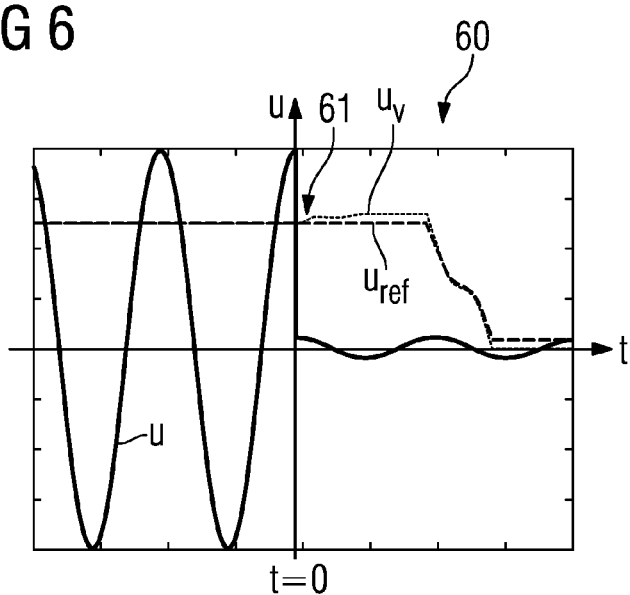
FIG. 6 shows a diagram with a voltage curve in the event of a short circuit on the monitored line.

The result of the fault assessment for a single-pole short circuit within the monitoring zone is illustrated in FIG. 6. In FIG. 6, the temporal curves of the voltage u actually measured at the measurement point 15a (see FIG. 1), the rectified reference voltage $U_{ref}$ and the rectified comparative voltage $U_v$ are illustrated in a diagram 60. Up to the occurrence of the short circuit at t=0, the values for the rectified reference voltage $U_{ref}$ and the rectified comparative voltage $U_v$ match, that is to say the difference between the two lies below a triggering threshold value. By contrast, an increase in the rectified comparative voltage $U_v$ can already be seen shortly after the occurrence of the short circuit at the point 61, whereas the rectified reference voltage $U_{ref}$ continues to remain constant, since it is formed on the basis of the pre-fault quantities. The difference of the rectified reference voltage and the rectified comparative voltage therefore exceeds the triggering threshold value for the first time at the point 61, and a corresponding fault signal to disconnect the line is generated.

It can be seen on the basis of the curve of the rectified comparative voltage $U_v$ in FIG. 6 that a certain number n of sampled values is always required to exceed the triggering threshold value in the event of short circuits within the monitoring zone. Nevertheless, with the example according to FIG. 6, a decision can be made within a length of time below a half period.

To summarize, it can be found that the presented method for detecting a short circuit on a line of an electrical energy supply network advantageously uses a fault evaluation on the basis of rectified values of the instantaneous reference voltage $u_{ref}$ and the comparative voltage $u_v$. Compared to instantaneous values, the use of rectified values has the advantage that a much more reliable decision with regard to a short circuit within the monitoring zone is possible, since outliers of individual sampled values do not immediately lead to a possible erroneous triggering. In addition, short-term measurement errors after the occurrence of an external short circuit, that is to say a short circuit located outside the monitoring zone, cannot lead directly to an erroneous triggering and therefore have a weaker influence on the behavior of the fault evaluation. In addition, it can be ensured that the accuracy of the fault evaluation is not influenced so heavily, even with an imprecise specification of the line parameters.

Figure 7:
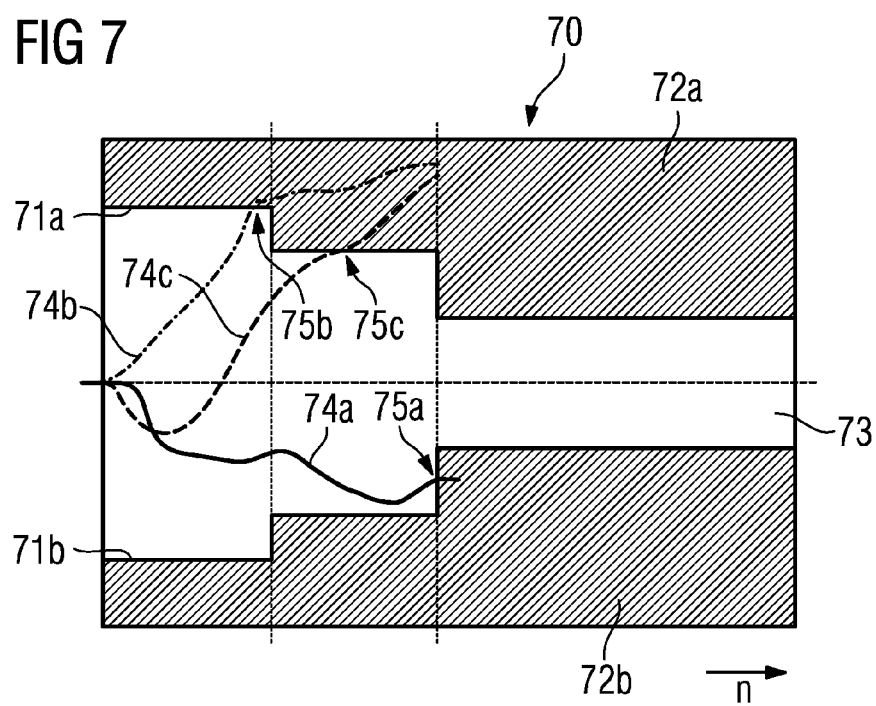
FIG. 7 shows a diagram in order to explain the dynamic matching of a triggering threshold value.

The characteristics of the triggering threshold value illustrated in FIG. 7 can additionally be used to stabilize the decision of the fault evaluation. To this end, FIG. 7 shows what is known as a triggering characteristic 70, which shows the progression of the triggering threshold value (which is given in the triggering characteristic 70 by a positive component 71a and a negative component 71b) with an increasing number n of sampled values of current and voltage used to calculate the rectified comparative voltage $U_v$. The hatched region 72a above the positive component 71a of the triggering threshold value shows the range for the difference of the rectified reference voltage $U_{ref}$ and the rectified comparative voltage $U_v$ within which an internal short circuit within the monitoring zone is established, whilst the region 72b below the negative component 71b of the triggering threshold value indicates an external short circuit located outside the monitoring zone. By contrast, a clear conclusion cannot be made within the intermediate region arranged between these two regions 72a and 72b. It can be seen that the intermediate region 73, within which a decision is not possible, decreases in steps with an increasing number n of sampled values of current and voltage used for the fault evaluation, since the value of the rectified comparative voltage $U_v$ can be determined in an increasingly reliable manner with an increasing number of sampled values, and therefore the reliability of the entire fault evaluation increases.

Three curves 74a-74c of the difference of the rectified comparative voltage $U_v$ and the rectified reference voltage $U_{ref}$ are illustrated by way of example in FIG. 7. The curve 74a assumes negative values early on and ultimately leads to the detection of an external fault at the point 75a. The curve 74b assumes positive values immediately after fault occurrence and leads rather early to the detection of an internal short circuit on the monitored line at point 75b. By contrast, the curve 74c initially assumes negative values, then positive values and ultimately leads at point 75c to a detection of an internal short circuit on the monitored line.

Besides the number of sampled values used for the fault evaluation, further factors may also determine the progression of the triggering threshold value (not illustrated in FIG. 7). For example, the region 73 within which a decision cannot be made may be larger, the greater the amount of interference present, for example in the form of harmonic components or frequency deviations with regard to the detected currents and voltages.

The described method can be performed with fewer resources as a result of the fault evaluation of superposed measures, and therefore the amount of processor capacity that a data processing device (CPU, DSP) of a protection device has to apply to perform the fault evaluation can be reduced. To this end, an examination as to whether a short circuit is actually present on the line can first be carried out merely on the basis of simple criteria. To this end, what is known as a jump detector is used, which examines the phase-to-phase currents of the respective phase conductors or values derived from the phase-to-phase currents (for example delta quantities based on the phase-to-phase currents, possibly in rectified form) for any current jumps and provides a first initiation signal if such a current jump, that is to say a change in current exceeding a current threshold value, has been detected.

Figure 8:
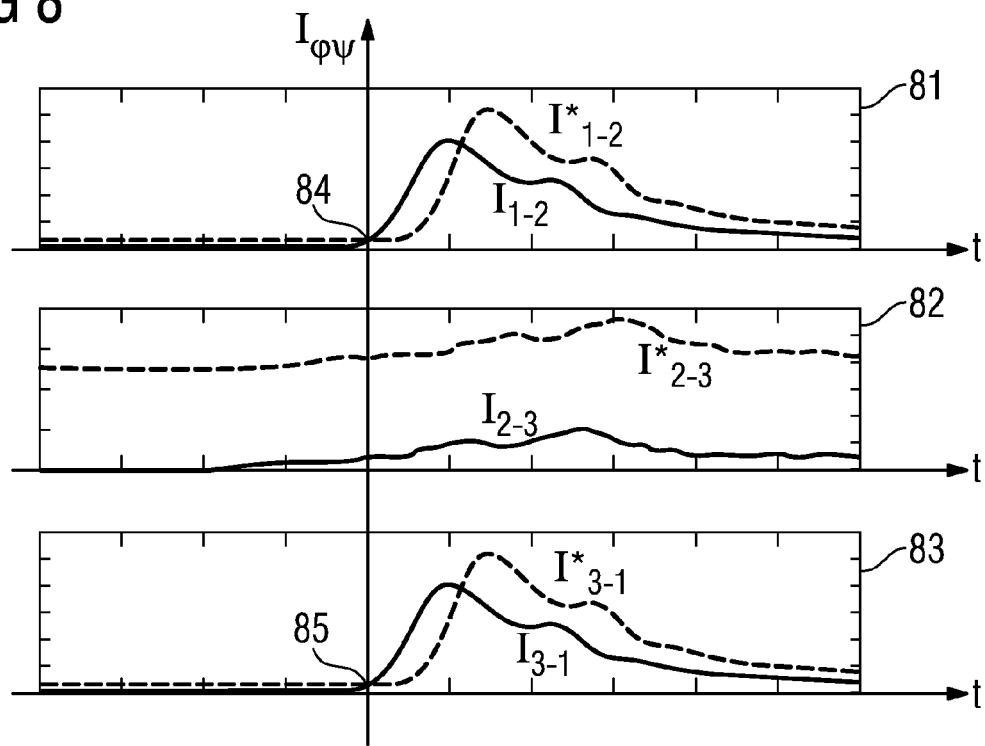
FIG. 8 shows three diagrams with current curves in the event of a short circuit on the monitored line in order to explain a jump detector.

In this regard, FIG. 8 shows a current curve $I_o$ detected by a jump detector; the indices $\phi$ and $\psi$ are used in this instance as wildcards for the individual phase conductors in question (phase 1, phase 2, phase 3) of the 3-phase line. In a first diagram 81, the current curve of the phase-to-phase current $I_{1-2}$ for the phase conductors phase 1 and phase 2 is thus illustrated in a dashed line. In the diagram 82, the phase-to-phase current $I_{2-3}$ for the phase conductors phase 2 and phase 3 is illustrated in a dashed line, whilst, lastly in diagram 83, the phase-to-phase current $I_{3-1}$ for the phase conductors phase 3 and phase 1 is illustrated in a dashed line. Respective jump threshold values $I_{1-2}^*$, $I_{2-3}^*$, $I_{3-1}^*$ are shown by the dashed line in each of the individual diagrams 81, 82, 83, wherein, in the exemplary embodiment according to FIG. 8, these jump threshold values are dynamically matched for example to the quantity of the flowing zero current to stabilize the jump detection.

It is assumed in the exemplary embodiment according to FIG. 8 that the phase 1 is affected by a single-pole short circuit. Accordingly, the current curves $I_{1-2}$ in diagram 81 and $I_{3-1}$ in diagram 83 at the points 84 and 85 demonstrate an infringement of the threshold value, whereas, in diagram 82, the current curve $I_{2-3}$ remains considerably below the curve of the jump threshold value $I_{2-3}^*$. In this example with infringement of the corresponding jump threshold values at points 84 and 85, the jump detector releases a first initiation signal, which for example can be used as a trigger signal for the subsequent fault evaluation of the current and voltage sampled values. If a first initiation signal is not generated by the jump detector, there is accordingly also no evaluation of the current and voltage sampled values in terms of a short circuit on the line, and therefore considerable processor resources of the CPU of the protection device can be saved as a result of the upstream arrangement of the jump detector.

A further option for saving processor power during the fault evaluation lies in performing, with the presence of the first initiation signal, a loop detection with which the respective loop affected by the short circuit (for example phase 1-earth or phase 2-phase 3) can be detected and the evaluation of the current and voltage sampled values can then be performed exclusively for the detected fault loop.

This will be explained in greater detail on the basis of FIG. 9.

Figure 9:
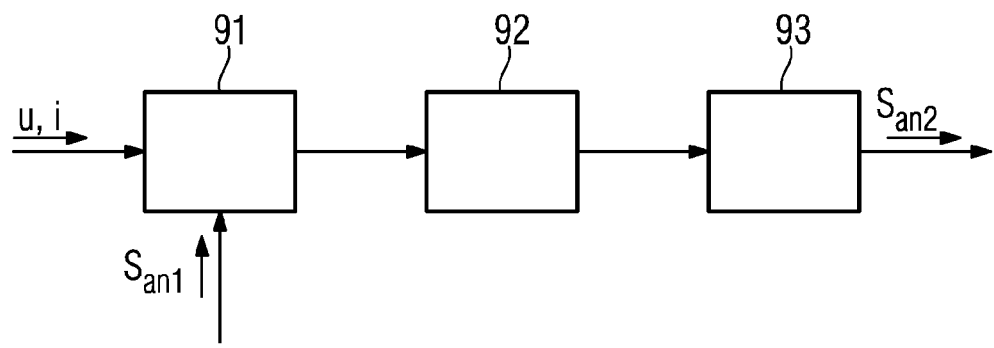
FIG. 9 shows a schematic block diagram in order to explain the operating principle of a loop selection.

To this end, FIG. 9 shows a block diagram of the operating principle of a loop detection function. A first initiation signal $S_{an1}$ generated by the jump detector is fed to a first processing block 91. The first initiation signal $S_{an1}$ is therefore used as a trigger so to speak to start the loop detection and means that sampled values u and i additionally present are read in at the first processing block 91. Rectified delta quantities of the currents and voltages are then calculated in the first processing block 91 and fed to a second processing block 92. The second processing block 92 performs various threshold value comparisons with regard to the delta quantities obtained from the current sampled values.

The result of this call-up is forwarded to a third processing block 93, which examines the results obtained in the second processing block 92 on the basis of further checks with regard to delta quantities obtained from the current and/or voltage sampled values. If the results from the second processing block 92 can be confirmed during the examination in the third processing block 93, the third processing block 93 thus releases a second initiation signal $S_{an2}$, which indicates the fault loop affected by the short circuit.

To test for a single-pole phase-to-earth short circuit, the following condition can be checked in the second processing block 92 for example (the indices φ, ψ and γ are used in this instance as wildcards for the naming of the three phases of the line):

$$\Delta I_{\psi\phi} > k_{ipp} \cdot \Delta I_{\phi\gamma} \text{ AND } \Delta I_{\psi\gamma} > k_{ipp} \Delta_{\phi\gamma} \text{ AND } \Delta I_{30} \geq kI_N.$$

In this case, $I_{30}$ stands for the zero system voltage, k with various indices stands for predefined comparative parameters. If the aforementioned condition is met, a corresponding intermediate signal is delivered to the third processing block 93. The third processing block 93 then reviews the result of the second processing block 92, for example by checking the following condition:

$$\Delta U_\psi > k_{upp} \cdot \Delta U_{\phi\gamma} \text{ OR } (\Delta I_\psi > k_{ip} \cdot \Delta I_\gamma \text{ AND } \Delta I_\psi > k_{ip} \cdot \Delta I_\phi).$$

If this condition is met, the third processing block 93 confirms the results of the second processing block 92 and delivers a second initiation signal $S_{an2}$, such that the loop "phase ψ-earth" is indicated as being affected by the short circuit.

During the loop selection process, the following condition may also be reviewed in the block 92:

$$\Delta I_{\psi\phi} > k_{ipp} \cdot \Delta I_{\psi\gamma} \text{ AND } \Delta I_{\psi\phi} > k_{ipp} \cdot \Delta I_{\phi\gamma}$$

If this condition is met, the processing block 92 thus delivers a corresponding intermediate signal to the processing block 93. This performs a revision on the basis of the following condition:

$$\Delta U_{\psi\phi} > k_{up} \cdot \Delta U_\gamma$$

If this is met, a second initiation signal $S_{an2}$ which indicates that the loop "phase ψ-phase φ" is affected by the fault is thus delivered by the third processing block 93.

The following condition is also checked in the third processing block 93:

$$\Delta U_\psi > k_{up} \neq \Delta U_\phi.$$

If this condition is met, a second initiation signal $S_{an2}$ which indicates that the loop "phase ψ-earth" as being affected by the fault is thus emitted.

In addition, the third processing block 93 performs the following check:

$$\Delta U_\phi > k_{up} \cdot \Delta_\psi.$$

If this condition is met, a second initiation signal $S_{a2}$ which indicates that the loop "phase φ-earth" as being affected by the fault is thus emitted.

Due to the reviews performed during the phase selection, the loop actually affected by the fault can be specified very reliably, and therefore the evaluation of the current and voltage sampled values merely has to be carried out with regard to the faulty loop specified by the loop selection.

Lastly, a "conventional" distance protection method may also be carried out in parallel with the described fault evaluation, said conventional distance protection method determining the short-circuit impedances on the basis of complex current and voltage values and comparing these with predefined triggering areas. The algorithm that first detects an internal short circuit in the monitoring zone of the line delivers a corresponding fault signal, which is converted by the protection device in question into a trigger signal to trigger the corresponding power circuit breaker. It can thus be ensured that clear short circuits, with which the rectified reference voltage and the rectified comparative voltage differ vastly from one another, lead to a rapid triggering with the fault evaluation process presented herein, whereas, with less clear short circuits, for example in the immediate vicinity of the tip points, it is possible to revert to the reliability of the consequently slower conventional distance protection method.

The invention claimed is:

1. A method for detecting a short circuit on a line of a multi-phase electrical energy supply network with grounded neutral, the method comprising the following steps: recording current and voltage sampled values at a measurement point at one end of the monitored line by an electrical protection device; generating a first fault signal indicating a short circuit on the line if a fault evaluation of the current and voltage sampled values performed by the electrical protection device indicates a short circuit present on the line; and performing the following steps for fault evaluation of the current and voltage sampled values: calculating instantaneous reference voltage values for a reference point on the line from instantaneous current and voltage sampled values recorded before an occurrence of the short circuit; calculating instantaneous comparative voltage values for the reference point on the line from instantaneous current and voltage sampled values recorded before the occurrence of the short circuit and instantaneous current and voltage sampled values recorded during the short circuit; calculating a rectified reference voltage value from consecutive instantaneous reference voltage values and a rectified comparative voltage value from consecutive instantaneous comparative voltage values; comparing the rectified reference voltage value and the rectified comparative voltage value; generating the first fault signal if a difference between the equivalent comparative voltage value and the rectified reference voltage value exceeds a triggering threshold value; and calculating the rectified reference voltage value by the following equation: U ref (n)=2 Nk=n−(N2−1)n(u ref (k)) ##EQU00011## where U.sub.ref(n): rectified reference voltage value; u.sub.ref(k): instantaneous reference voltage value for the sampled value k; n: number of the sampled value after fault occurrence; N: number of sampled values per period; k: summation index; and calculating a rectified comparative voltage value in accordance with the following equation: UV(n)=2Nk=n−(N2−1) n(uV(k)) ##EQU00012## where U.sub.v(n): rectified comparative voltage value; u.sub.v(k): instantaneous comparative voltage value for the sampled value k; n: number of the sampled value after fault occurrence; N: number of sampled values per period; and k: summation index.

2. The method according to claim 1, which further comprises calculating the instantaneous reference voltage values by the following equation:

$$u_{ref}(n) = u_p(n) - L_{ref} \frac{i_p(n) - i_p(n-1)}{T} - R_{ref} \cdot i_p(n),$$

where $u_{ref}(n)$: instantaneous reference voltage value;
$u_p(n)=u(n-N)$: pre-fault voltage sampled value a period before the instantaneous voltage sampled value u(n);
$i_p(n)=i(n-N)$: pre-fault current sampled value a period before the instantaneous current sampled value i(n);
T: period;
N: number of sampled values per period;

n: number of the sampled value after fault occurrence;
$L_{ref}$: inductance of the line from the measurement point to the reference point; and
$R_{ref}$: resistance of the line from the measurement point to the reference point.

3. The method according to claim 1, which further comprises calculating the instantaneous comparative voltage values by the following equation:

$$u_v(n) = \Delta u_f(n) - L_{ref} \frac{\Delta i_f(n) - \Delta i_f(n-1)}{T} - R_{ref} \cdot \Delta i_f(n),$$

where
$u_v(n)$: instantaneous comparative voltage value;
$\Delta u_f(n)$: instantaneous delta voltage value after fault occurrence;
$\Delta i_f(n)$: instantaneous delta current value after fault occurrence;
$L_{ref}$: inductance of the line from the measurement point to the reference point;
$R_{ref}$: resistance of the line from the measurement point to the reference point;
T: period; and
n: number of the sampled value after fault occurrence.

4. The method according to claim 3, which further comprises establishing the instantaneous delta voltage values by the following equation:

$$\Delta u_f(n) = u(n) - u_p(n)$$

where
$\Delta u_f(n)$: instantaneous delta voltage value after fault occurrence;
u(n): instantaneous voltage sampled value after fault occurrence;
$u_p(n) = u(n-N)$: pre-fault voltage sampled value, a period before the instantaneous voltage sampled value u(n);
n: number of the sampled value after fault occurrence;
N: number of the sampled values per period; and
establishing instantaneous delta current values by the following equation:

$$\Delta i_f(n) = i(n) - i_p(n)$$

where
$\Delta i_f(n)$: instantaneous delta current value after fault occurrence;
i(n): instantaneous current sampled value after fault occurrence;
$i_p(n) = i(n-N)$: pre-fault current sampled value a period before the instantaneous current sampled value i(n);
n: number of the sampled value after fault occurrence; and
N: number of the sampled values per period.

5. The method according to claim 1, which further comprises using an end of a monitoring zone on the line monitored by the protection device as the reference point.

6. The method according to claim 1, which further comprises:
detecting a start of a short circuit with the protection device when the recorded current sampled values have a current jump exceeding a jump threshold value;
generating a first initiation signal upon the protection device detecting a start of a short circuit; and
only starting the fault evaluation of the current and voltage sampled values with the protection device once the first initiation signal is present.

7. The method according to claim 6, which further comprises:
upon the presence of a first initiation signal, first examining the current and voltage sampled values with the protection device to establish which phase conductor of the line is affected by the short circuit;
generating a second initiation signal indicating at least one phase conductor affected by the short circuit; and
performing the fault evaluation with the protection device merely with regard to the at least one phase conductor indicated by the second initiation signal.

8. The method according to claim 1, which further comprises dynamically determining the triggering threshold value in such a way that a value of the triggering threshold value decreases at least in steps with an increasing number of the current and voltage sampled values used to calculate the rectified comparative voltage value.

9. The method according to claim 1, which further comprises:
additionally using the instantaneous current and voltage sampled values to calculate a complex impedance value of the line monitored by the protection device; and
generating a second fault signal indicating a short circuit on the line with the protection device if the complex impedance value lies within a predefined triggering area in a complex plane.

10. The method according to claim 9, which further comprises generating a trigger signal with the protection device as soon as the first or the second fault signal is present, to trigger a power circuit breaker defining the line.

11. A protection device for monitoring a line of a multiphase electrical energy supply network with grounded neutral for short circuits occurring on the line, the protection device configured to perform the method steps according to claim 1.

* * * * *